(12) United States Patent
Adkisson et al.

(10) Patent No.: US 7,205,627 B2
(45) Date of Patent: Apr. 17, 2007

(54) IMAGE SENSOR CELLS (75) Inventors: James W. Adkisson, Jericho, VT (US); John J. Ellis-Monaghan, Grand Isle, VT (US); Jeffrey P. Gambino, Westford, VT (US); Mark D. Jaffe, Shelburne, VT (US); Richard J. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,510

(22) Filed: Feb. 23, 2005

(65) Prior Publication Data

US 2006/0186505 A1 Aug. 24, 2006

(51) Int. Cl.
*H01L 31/06* (2006.01)
(52) U.S. Cl. ............ 257/463; 257/292; 250/208.1
(58) Field of Classification Search ............ 250/214.1, 250/208.1; 257/463, 292
See application file for complete search history.

(56) References Cited

U.S. PATENT DOCUMENTS

| | | | |
|---|---|---|---|
| 5,898,196 A * | 4/1999 | Hook et al. ............... | 257/292 |
| 6,127,697 A | 10/2000 | Guidash | |
| 6,180,969 B1 * | 1/2001 | Yang et al. ............... | 257/291 |
| 6,218,691 B1 | 4/2001 | Chung et al. | |
| 6,258,636 B1 * | 7/2001 | Johnson et al. ............ | 438/149 |
| 6,297,070 B1 | 10/2001 | Lee et al. | |
| 6,462,365 B1 * | 10/2002 | He et al. .................. | 257/292 |
| 6,504,195 B2 | 1/2003 | Guidash | |
| 6,713,796 B1 | 3/2004 | Fox | |
| 6,730,899 B1 | 5/2004 | Stevens et al. | |
| 6,744,084 B2 * | 6/2004 | Fossum ................... | 257/292 |
| 6,750,490 B2 | 6/2004 | Berezin | |
| 6,885,047 B2 * | 4/2005 | Shinohara et al. ......... | 257/292 |
| 6,921,934 B2 * | 7/2005 | Patrick .................... | 257/292 |
| 2002/0190288 A1 | 12/2002 | Lee et al. | |
| 2003/0062561 A1 | 4/2003 | Guidash | |
| 2004/0007754 A1 | 1/2004 | Adachi et al. | |
| 2005/0051701 A1 * | 3/2005 | Hong ..................... | 250/214.1 |
| 2005/0064617 A1 * | 3/2005 | Dierickx .................. | 438/48 |
| 2005/0269606 A1 * | 12/2005 | Mouli .................... | 257/292 |

FOREIGN PATENT DOCUMENTS

JP 1135184 A 5/1989

* cited by examiner

*Primary Examiner*—Andy Huynh
*Assistant Examiner*—Tram Hoang Nguyen
(74) *Attorney, Agent, or Firm*—Schmeiser, Olsen & Watts; Anthony J. Canale (57) ABSTRACT

A structure (and method for forming the same) for an image sensor cell. The structure includes (a) a semiconductor substrate; (b) a charge collection well on the substrate, the charge collection well comprising a semiconductor material doped with a first doping polarity; (c) a surface pinning layer on and in direct physical contact with the charge collection well, the surface pinning layer comprising a semiconductor material doped with a second doping polarity opposite to the first doping polarity; and (d) an electrically conducting push electrode being in direct physical contact with the surface pinning layer but not being in direct physical contact with the charge collection well.

9 Claims, 10 Drawing Sheets

IMAGE SENSOR CELLS

BACKGROUND OF THE INVENTION

1. Technical Field

The present invention relates to image sensor cells, and more specifically, to CMOS (complementary Metal Oxide Silicon) image sensor cells.

2. Related Art

A typical image sensor cell includes a photodiode, a reset circuit, a transfer circuit, and a sensing circuit. The photodiode is adapted for accumulating charges when being placed on the path of light. The operation of the typical image sensor cell is as follows. During a reset cycle, the photodiode is electrically coupled to a DC (direct current) voltage source via the reset circuit so that the photodiode is brought to a predetermined potential. Next, the photodiode is electrically disconnected from the DC voltage source (by disabling the reset circuit). Next, during an image capturing cycle, the photodiode is exposed to light. In response, the photodiode accumulates charges proportional to the strength of light (i.e., number of photons/$cm^2$/second) incident on the photodiode. Next, in a readout cycle, the accumulated charges in the photodiode is transferred out of the photodiode to the sensing circuit via the transfer circuit.

Once optimized, a typical image sensor cell cannot increase its charge capacity without increasing the potential barrier between the photodiode and the transfer gate. However, when the potential barrier is increased, all the accumulated charges on the photodiode cannot be transferred through the barrier to the transfer gate. This problem is called image lag. As a result, there is a need for a new structure (and method for forming the same) which allows the transfer of essentially all accumulated charges from the photodiode to the sensing circuit for high charge capacity cells.

SUMMARY OF THE INVENTION

The present invention provides a semiconductor structure, comprising (a) a semiconductor substrate; (b) a charge collection well on the substrate, the charge collection well comprising a first semiconductor material doped with a first doping polarity; (c) a surface pinning layer on and in direct physical contact with the charge collection well, the surface pinning layer comprising a second semiconductor material doped with a second doping polarity opposite to the first doping polarity; and (d) an electrically conducting push electrode being in direct physical contact with the surface pinning layer but not being in direct physical contact with the charge collection well, wherein in response to the surface pinning layer and the charge collection well being in a path of light, the charge collection well is adapted for accumulating charges, wherein a P-N junction between the surface pinning layer and the charge collection well is adapted for becoming reverse-biased in response to the electrically conducting push electrode being at a charge pushing potential, wherein the charge pushing potential is lower than a potential of the substrate if the first doping polarity is an N-type, and wherein the charge pushing potential is higher than the potential of the substrate if the first doping polarity is a P-type.

The present invention also provides a semiconductor structure fabrication method, comprising the steps of (a) providing a semiconductor substrate; (b) forming a charge collection well in the semiconductor substrate, the charge collection well comprising a first semiconductor material doped with a first doping polarity; (c) forming a surface pinning layer on and in direct physical contact with the charge collection well, the surface pinning layer comprising a second semiconductor material doped with a second doping polarity opposite to the first doping polarity; (d) forming a cushion region in the semiconductor substrate so as to push the charge collection well to a sufficient distance from where an electrically conducting push electrode is to be formed such that the electrically conducting push electrode can be later formed not in direct physical contact with the charge collection well; and (e) forming the electrically conducting push electrode being in direct physical contact with the surface pinning layer but not in direct physical contact with the charge collection well.

The present invention also provides a semiconductor structure fabrication method, comprising the steps of (a) providing a semiconductor substrate; (b) forming a charge collection well in the semiconductor substrate, the charge collection well comprising a first semiconductor material doped with a first doping polarity; (c) forming a surface pinning layer on and in direct physical contact with the charge collection well, the surface pinning layer comprising a second semiconductor material doped with a second doping polarity opposite to the first doping polarity; (d) forming a cushion region in the semiconductor substrate so as to push the charge collection well to a sufficient distance from where an electrically conducting push electrode is to be formed such that the electrically conducting push electrode can be later formed not in direct physical contact with the charge collection well; and (e) forming the electrically conducting push electrode being in direct physical contact with the surface pinning layer but not in direct physical contact with the charge collection well, wherein the cushion region is doped with a dopant concentration sufficient to create a depletion region in the charge collection well, and wherein the depletion region in the charge collection well physically separates the charge collection well into first and second charge collection regions.

The present invention also provides a new structure (and method for forming the same) which allows the transfer of essentially all accumulated charges from the photodiode to the sensing circuit.

DETAILED DESCRIPTION OF THE INVENTION

Figure 1:
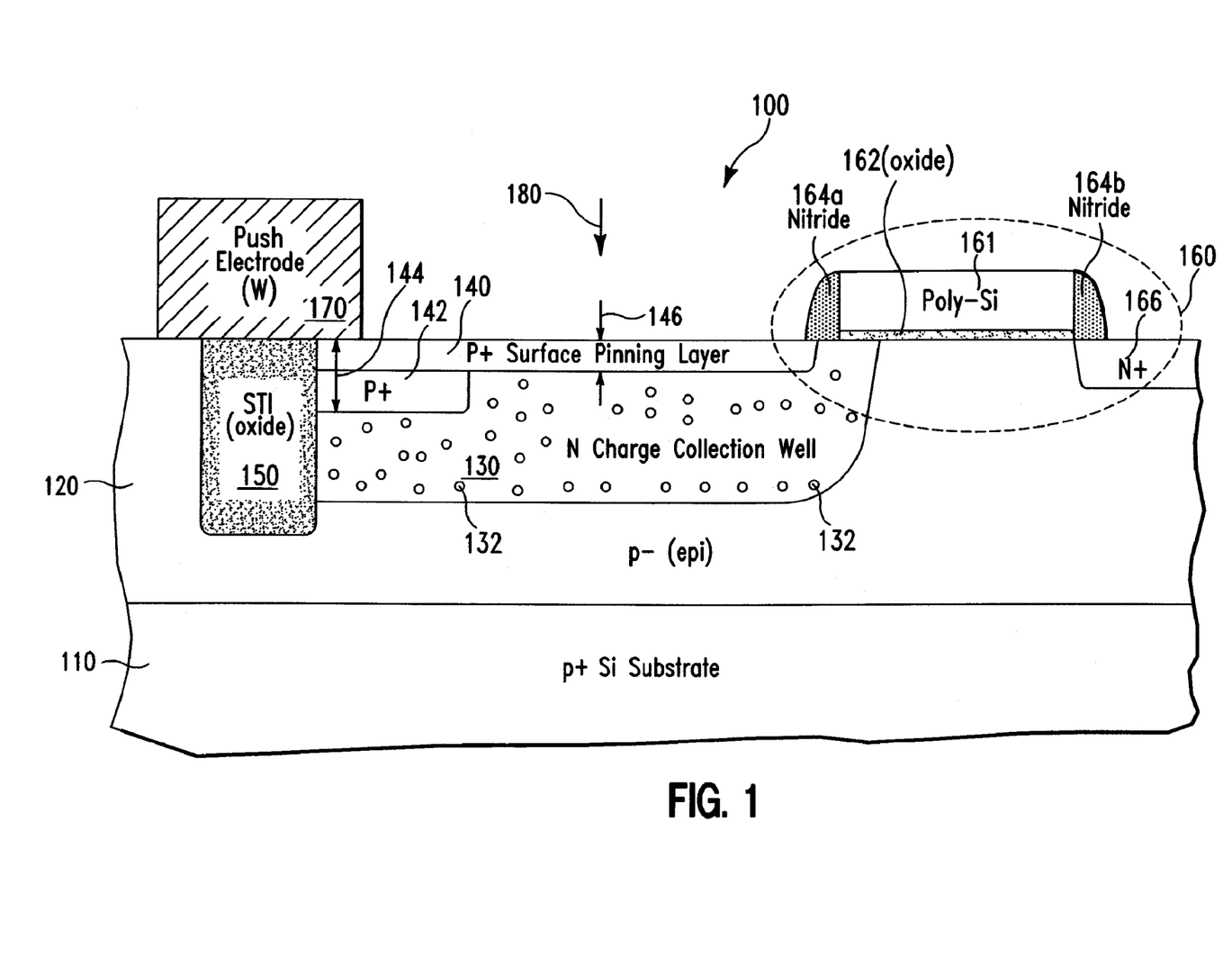
FIGS. 1–3 each illustrates a cross-section view of a semiconductor structure, in accordance with embodiments of the present invention.

FIG. 1 illustrates a cross-section view of a first semiconductor structure 100, in accordance with embodiments of the present invention. More specifically, in one embodiment, the structure 100 can comprise a P+ semiconductor (silicon, germanium, etc.) substrate 110. Hereinafter, "P" means doped with P-type dopants such as boron atoms. "N" means doped with N-type dopants such as phosphorus atoms. A plus sign "+" that follows "P" or "N" (if any) indicates heavily doped. A minus sign "−" that follows "P" or "N" (if any) indicates lightly doped.

The structure 100 can further comprise a P− semiconductor layer 120 on top of the semiconductor substrate 110. In one embodiment, the semiconductor layer 120 can comprise silicon and can be formed by an epitaxial growth process.

The structure 100 can further comprise a photo diode 130,140,142 in the semiconductor layer 120. The photo diode 130,140,142 can comprise an N charge collection well 130 and a P+ surface pinning layer 140,142. In general, the P+ surface pinning layer 140,142 has a thickness 146. However, the surface pinning layer 140,142 includes a cushion region 142 that results in the surface pinning layer 140,142 having a greater thickness 144 between the N charge collection well 130 and a push electrode 170. The push electrode 170 can comprise tungsten (W). In one embodiment, the thickness 144 is sufficiently large such that the push electrode 170 when formed does not short to (i.e., does not come into direct physical contact with) the N charge collection well 130.

The structure 100 can further comprise a transfer transistor 160. In one embodiment, the transfer transistor 160 can comprise a gate dielectric layer 162, a gate region 161, gate spacers 164a and 164b, first and second source/drain (S/D) regions. The first S/D region can be the N charge collection well 130. The second S/D region can be the N+ region 166. In one embodiment, the gate dielectric layer 162 can comprise an oxide material (e.g., silicon dioxide). The gate region 161 can comprise polysilicon. The gate spacers 164a and 164b can comprise a nitride material (e.g., silicon nitride).

The structure 100 can further comprise a shallow trench isolation (STI) region 150 that physically isolates the photodiode 130,140,142 from other devices (not shown) in the semiconductor layer 120.

The operation of the structure 100 can be described as follows. During an image capturing cycle, the photodiode 130,140,142 is exposed to light 180. In response, the N charge collection well 130 accumulates charges (electrons 132) whose quantity is proportional to the strength of the light 180 incident on the photodiode 130,140,142. Next, in a readout cycle, the transfer transistor 160 is turned on so that the accumulated electrons 132 can be transferred out of the N charge collection well 130 through the transfer transistor 160 to the S/D region 166 and then to a sensing circuit (not shown) that is coupled to the S/D region 166. In one embodiment, during the readout cycle, the push electrode 170 can be biased to a voltage potential (called a charge pushing potential) lower than that of the P+ substrate 110. If the P+ substrate 110 is grounded, then the push electrode 170 can be negatively biased. The potential difference between the P+ substrate 110 and the push electrode 170 helps push the accumulated electrons 132 out of the N charge collection well 130 through the transfer transistor 160 to the S/D region 166.

It should be noted that when the push electrode 170 is negatively biased, a p-n junction (not shown) between the P+ surface pinning layer 140,142 and the N charge collection well 130 becomes reverse-biased.

It should also be noted that if the opposite doping polarity (P and N are opposite doping polarities) is used for each of the regions of the structure 110, the push electrode 170 can be positively (instead of negatively) biased so as to help push accumulated holes in the P charge collection well 130 through the transfer transistor 160 to the P+ S/D region 166.

It should also be noted that the photodiode 130,140,142 and the transfer transistor 160 are only parts of a first image sensor cell (not shown). In one embodiment, a second neighboring image sensor cell (not shown) that is similar to the first image sensor cell can be formed to the left of the push electrode 170 and the STI region 150. The push electrode 170 can be shared by the first and second image sensor cells. In other words, the push electrode 170 can be in direct physical contact with both P+ surface pinning layers of the first and second image sensor cells. It should also be noted that the push electrode can be shared by two or more cells.

Figure 2:
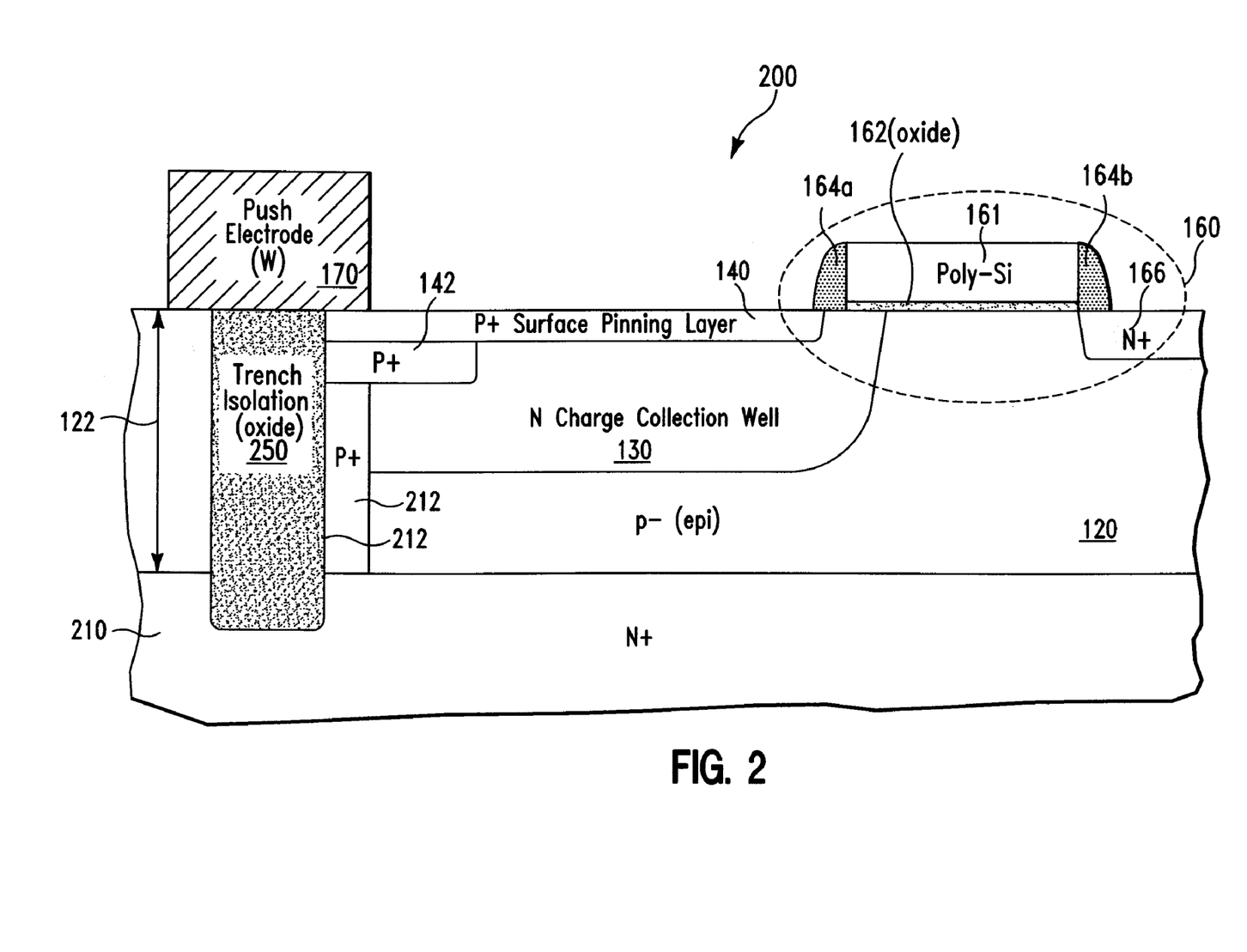

FIG. 2 illustrates a cross-section view of a second semiconductor structure 200, in accordance with embodiments of the present invention. In one embodiment, the structure 200 can be similar to the structure 100 of FIG. 1 except the following. First, unlike the substrate 110 of FIG. 1, the substrate 210 is N+. Second, the trench isolation region 250 is deeper than the depth 122 of the P− semiconductor layer 120 (i.e., extending down to the N+ substrate 210). The trench isolation region 250 helps prevent cross talk between neighboring image sensor cells (not shown) to the left and to the right of the trench isolation region 250. Finally, third, a P+ separating region 212 physically separates the N charge collection well 130 and the trench isolation region 250. If the N charge collection well 130 is in direct physical contact with the trench isolation region 250, there would be a leakage current of electrons flowing from the interfacing surface 252 into the N charge collection well 130. With the presence of the P+ separating region 212, the N charge collection well 130 is physically separated from the trench isolation region 250. As a result, such leakage current is reduced. The operation of the structure 200 is similar to that of the structure 100 of FIG. 1.

Figure 3:
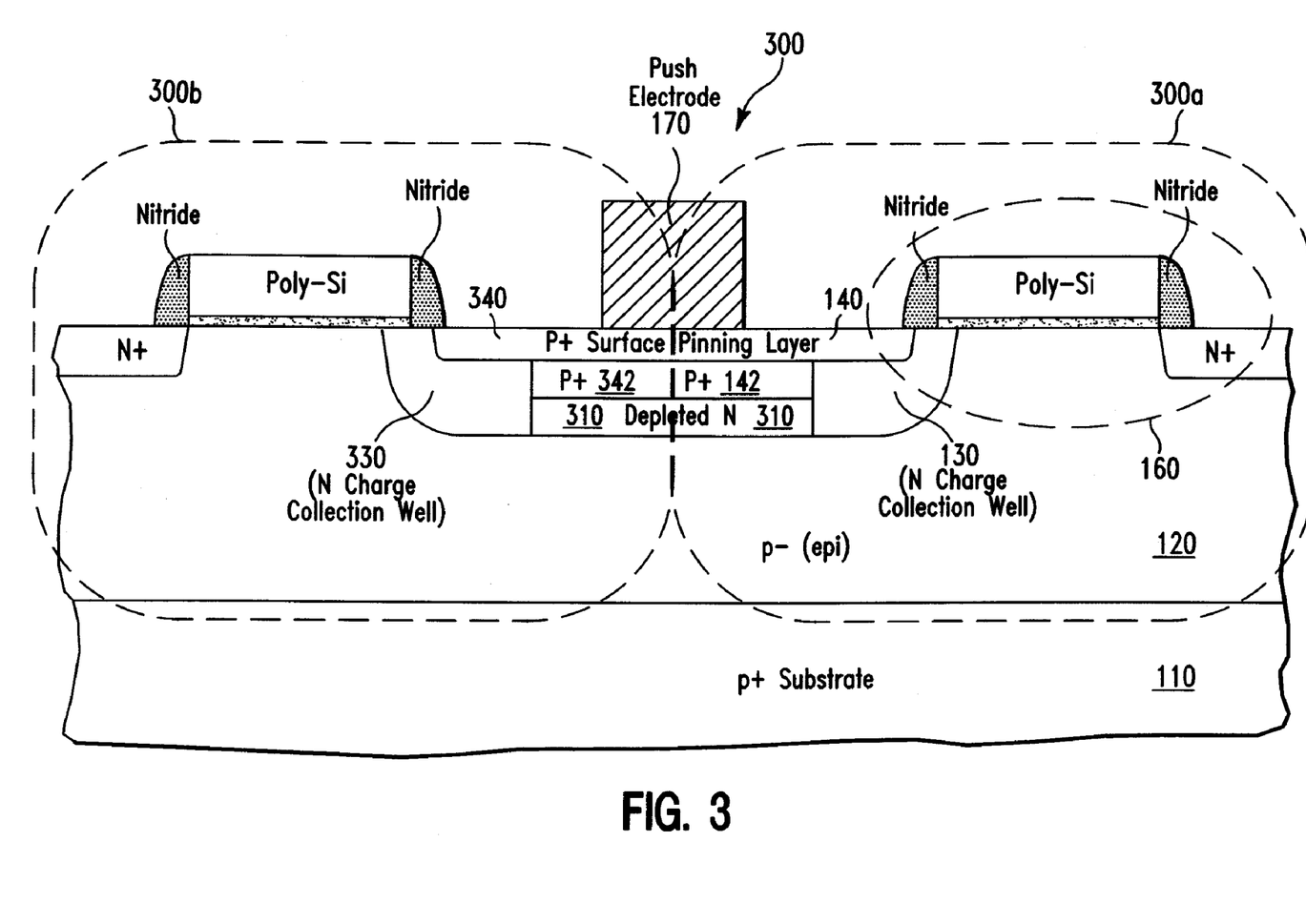

FIG. 3 illustrates a cross-section view of a third semiconductor structure 300, in accordance with embodiments of the present invention. In one embodiment, the structure 300 can comprise two image sensor cells 300a and 300b each of which is similar to the structure 100 of FIG. 1 except the following. First, there is no trench isolation region like the STI region 150 of FIG. 1 that separates the two neighboring image sensor cells 300a and 300b. As a result, the P+ surface pinning layer 140,142 of the image sensor cells 300a merges with its counter part (i.e., the P+ surface pinning layer 340,342) of the image sensor cells 300b.

Second, the N charge collection well 130 of the image sensor cells 300a is physically separated from the N charge collection well 330 of the image sensor cells 300b by a depleted N semiconductor region 310. Because the depleted N semiconductor region 310 is depleted of electrons, the two N charge collection wells 130 and 330 are electrically disconnected from each other. As a result, there is no cross talk between the two image sensor cells 300a and 300b. The formation of the depleted N semiconductor region 310 will be discussed below with reference to FIGS. 6A–6B. The operation of each of the image sensor cells 300a and 300b is similar to that of the structure 100 of FIG. 1

Figure 4A:
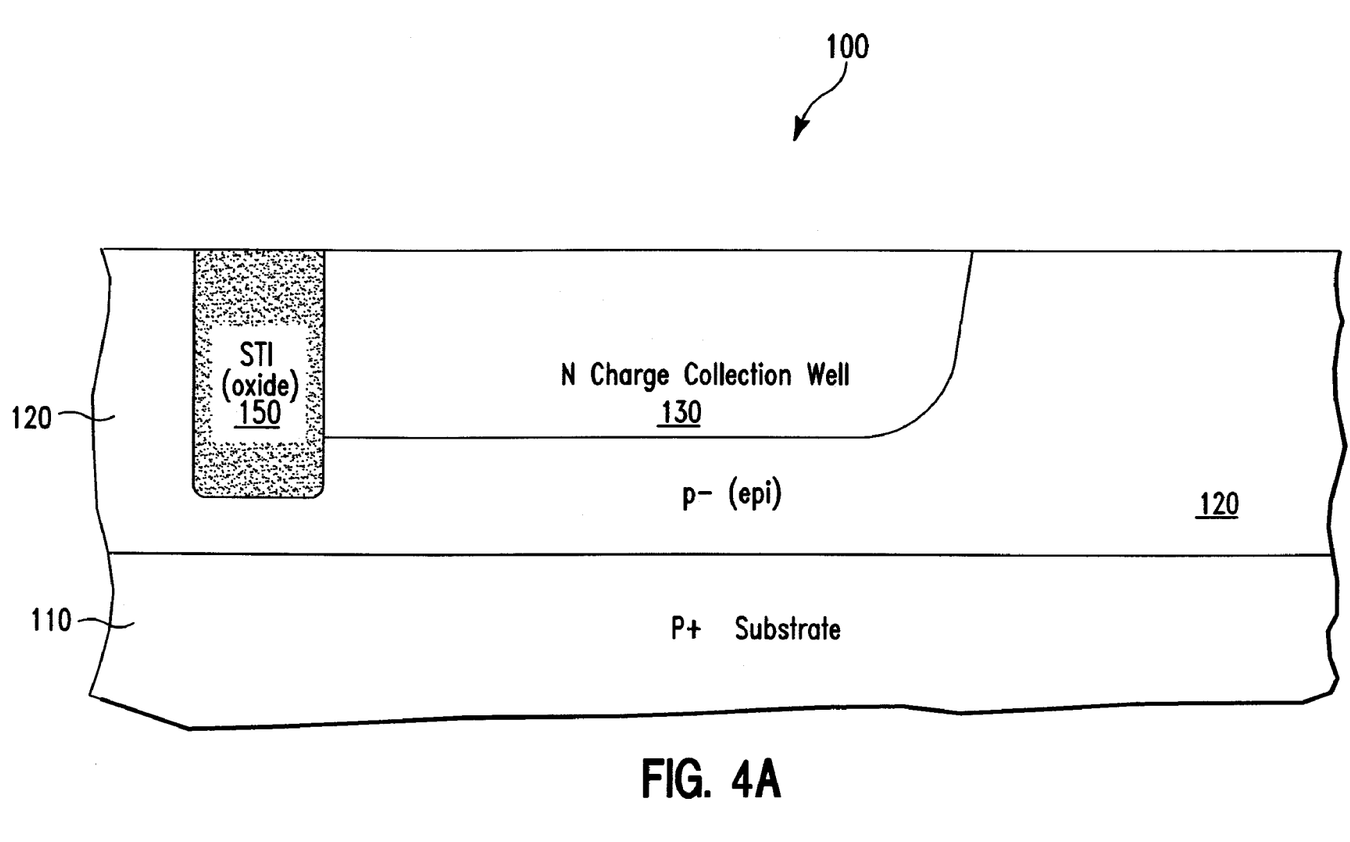
FIGS. 4A–4C illustrate a method for forming the semiconductor structure of FIG. 1, in accordance with embodiments of the present invention.
Figure 4B:
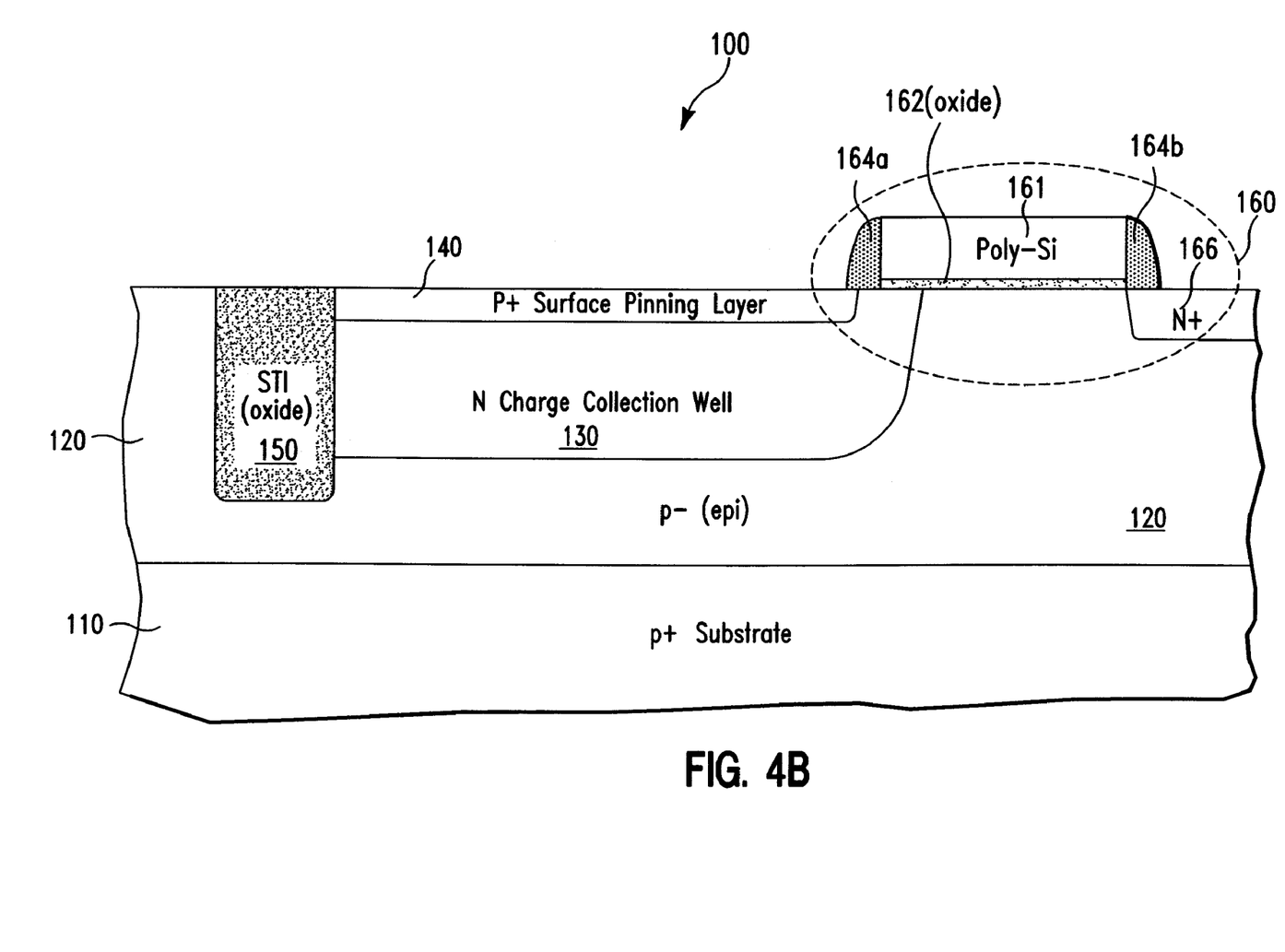
Figure 4C:
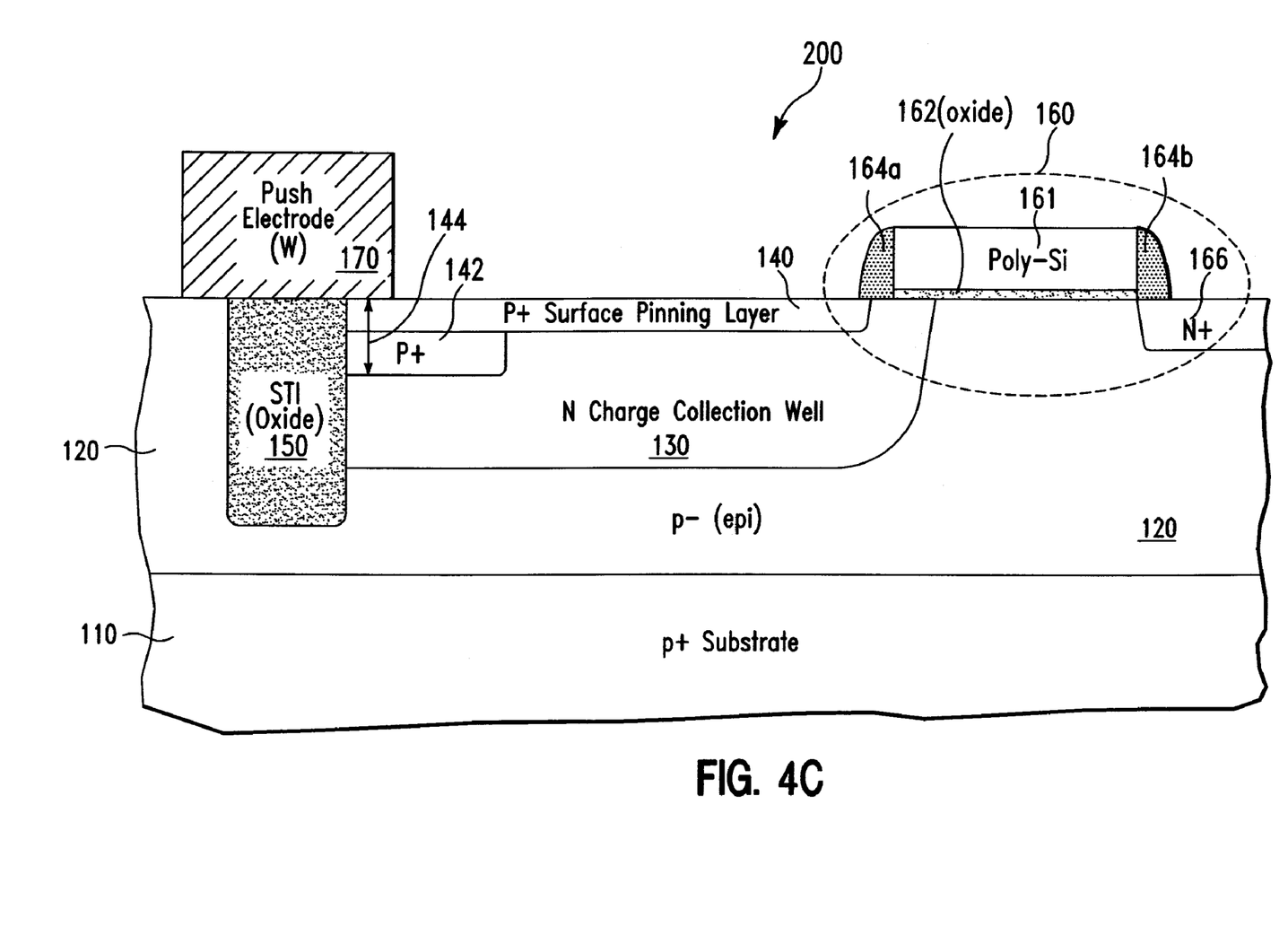

FIGS. 4A–4C illustrate a method for forming the semiconductor structure 100 of FIG. 1, in accordance with embodiments of the present invention. More specifically, with reference to FIG. 4A, the formation of the semiconductor structure 100 can start with the P+ silicon substrate 110.

Next, the P− silicon layer 120 can be formed on top of the P+ silicon substrate 110 by, illustratively, epitaxial growth. Next, the STI region 150 can be formed in the P− silicon layer 120. Next, the N charge collection well 130 can be formed in the P– silicon layer 120 and adjacent to the STI region 150. More specifically, in one embodiment, the formation of the N charge collection well 130 can start with a step of forming a mask (not shown) followed by an ion implantation step.

Next, with reference to FIG. 4B, the transfer transistor 160 can be formed. In one embodiment, the gate dielectric layer 162 and the gate region 161 can be formed first. Then, the gate spacers 164a and 164b can be formed on sidewalls of the gate region 161. Then, the N+ S/D region 166 can be formed by, illustratively, ion implantation, using the gate region 161 and the gate spacers 164a and 164b as a mask. Next, a P+ surface pinning layer 140 can be formed at top of the N charge collection well 130.

Next, with reference to FIG. 4C, the cushion region 142 of the P+ surface pinning layer 140,142 can be formed by, illustratively, forming a mask (not shown) followed by an ion implantation process. Next, the push electrode 170 can be formed in direct physical contact with the P+ surface pinning layer 140,142. Again, the depth 144 of the cushion region 142 should be sufficiently large such that the push electrode 170 when formed does not short to (i.e., does not come into direct physical contact with) the N charge collection well 130.

Figure 5A:
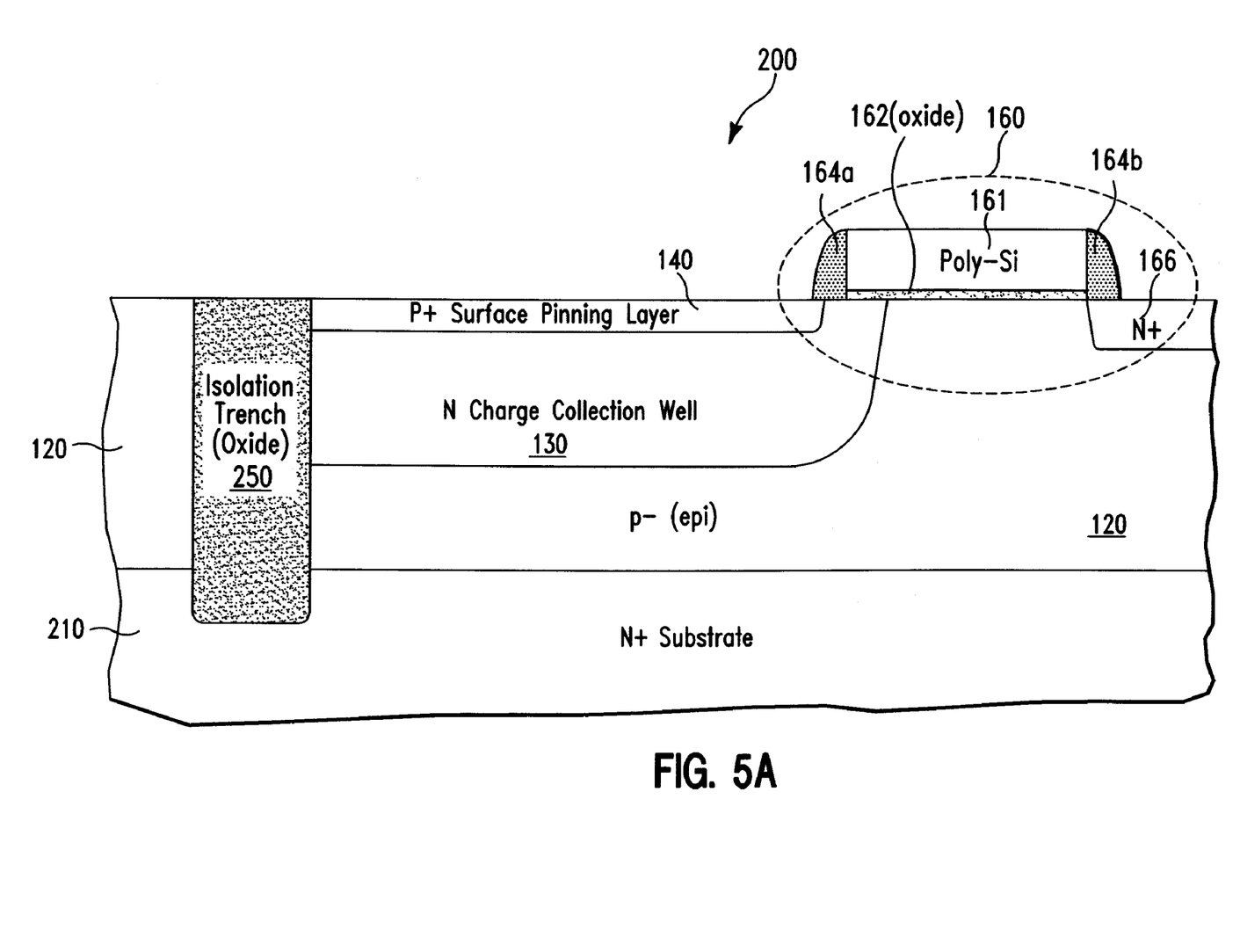
FIGS. 5A–5B illustrate a method for forming the semiconductor structure of FIG. 2, in accordance with embodiments of the present invention.
Figure 5B:
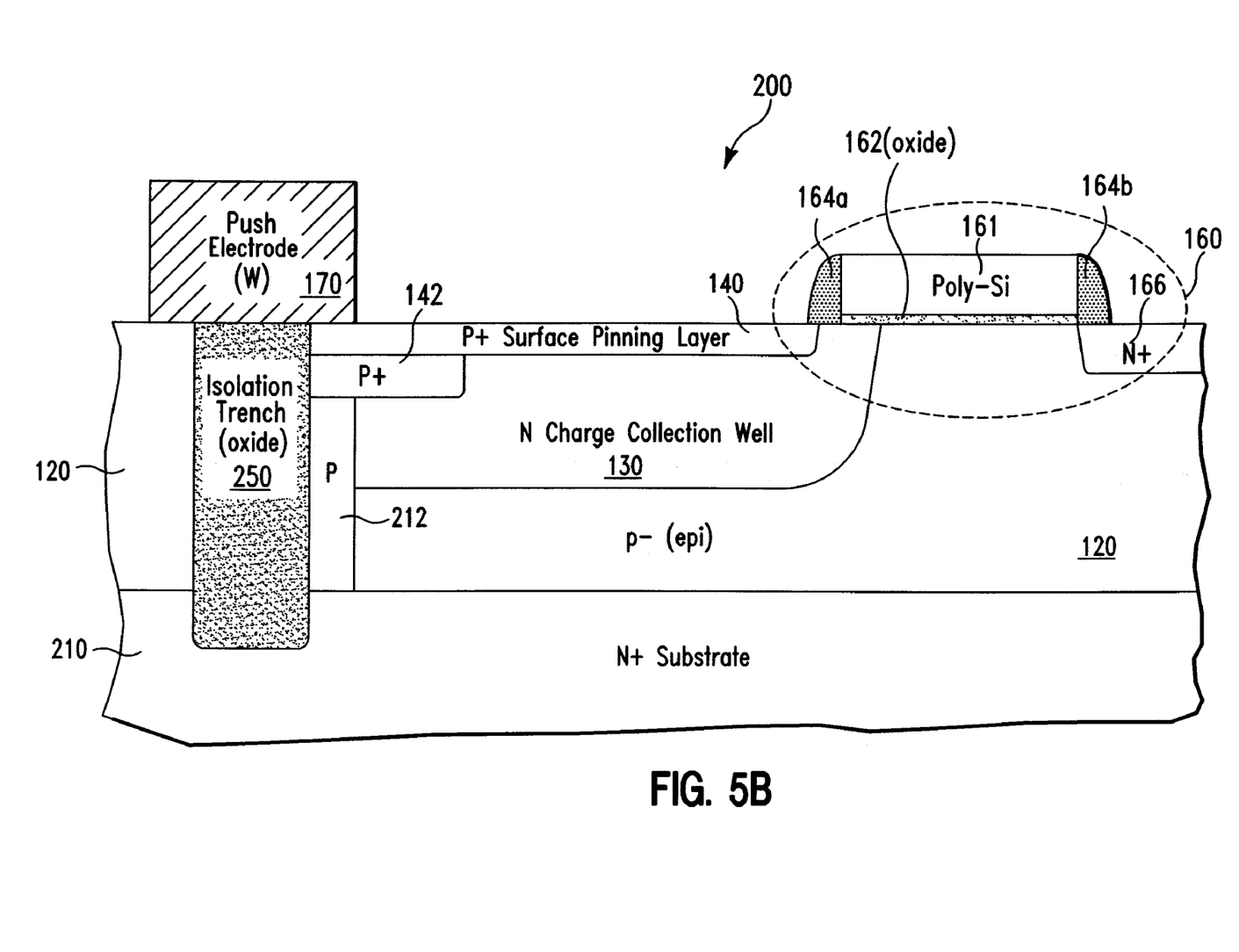

FIGS. 5A–5B illustrate a method for forming the semiconductor structure 200 of FIG. 2, in accordance with embodiments of the present invention. More specifically, with reference to FIG. 5A, the formation of the semiconductor structure 200 can start with the N+ silicon substrate 210.

Next, the P– silicon layer 120 can be formed on top of the N+ silicon substrate 210 by, illustratively, epitaxial growth. Next, the trench isolation region 250 can be formed in the P– silicon layer 120 and the N+ silicon substrate 210. Next, the N charge collection well 130 can be formed in the P– silicon layer 120 and adjacent to the isolation region 250. More specifically, in one embodiment, the formation of the N charge collection well 130 can start with a step of forming a mask (not shown) followed by an ion implantation step. Next, the transfer transistor 160 can be formed. Next, the P+ surface pinning layer 140 can be formed at top of the N charge collection well 130.

Next, with reference to FIG. 5B, the cushion region 142 of the P+ surface pinning layer 140,142 can be formed by, illustratively, forming a mask (not shown) followed by an ion implantation process. Next, the P+ separating region 212 can be formed that physically separates the N charge collection well 130 and the trench isolation region 250. In one embodiment, the P+ separating region 212 can be formed by first forming a mask (not shown) followed by an ion implantation step. Alternatively, during the formation of the trench isolation region 250, the material used to fill the trench 250 to form the trench isolation region 250 can comprise a P glass material such as Boron containing glass. As a result, later, the P+ separating region 212 can be formed by heating the trench isolation region 250 so as to diffuse the Boron atoms out of the trench isolation region 250 so as to form the P+ separating region 212. Finally, the push electrode 170 can be formed in direct physical contact with the P+ surface pinning layer 140,142.

Figure 6A:
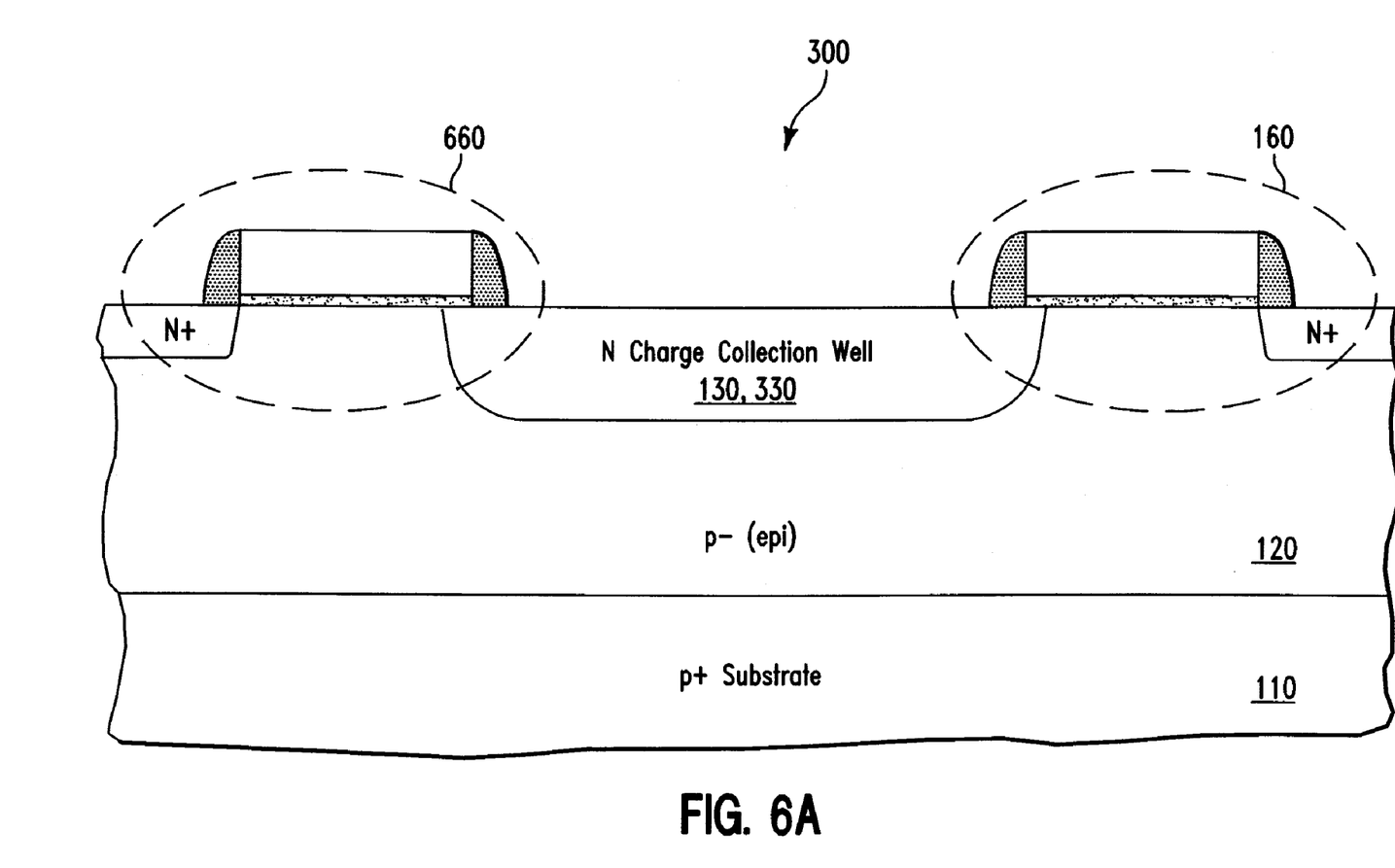
FIGS. 6A–6B illustrate a method for forming the semiconductor structure of FIG. 3, in accordance with embodiments of the present invention.
Figure 6B:
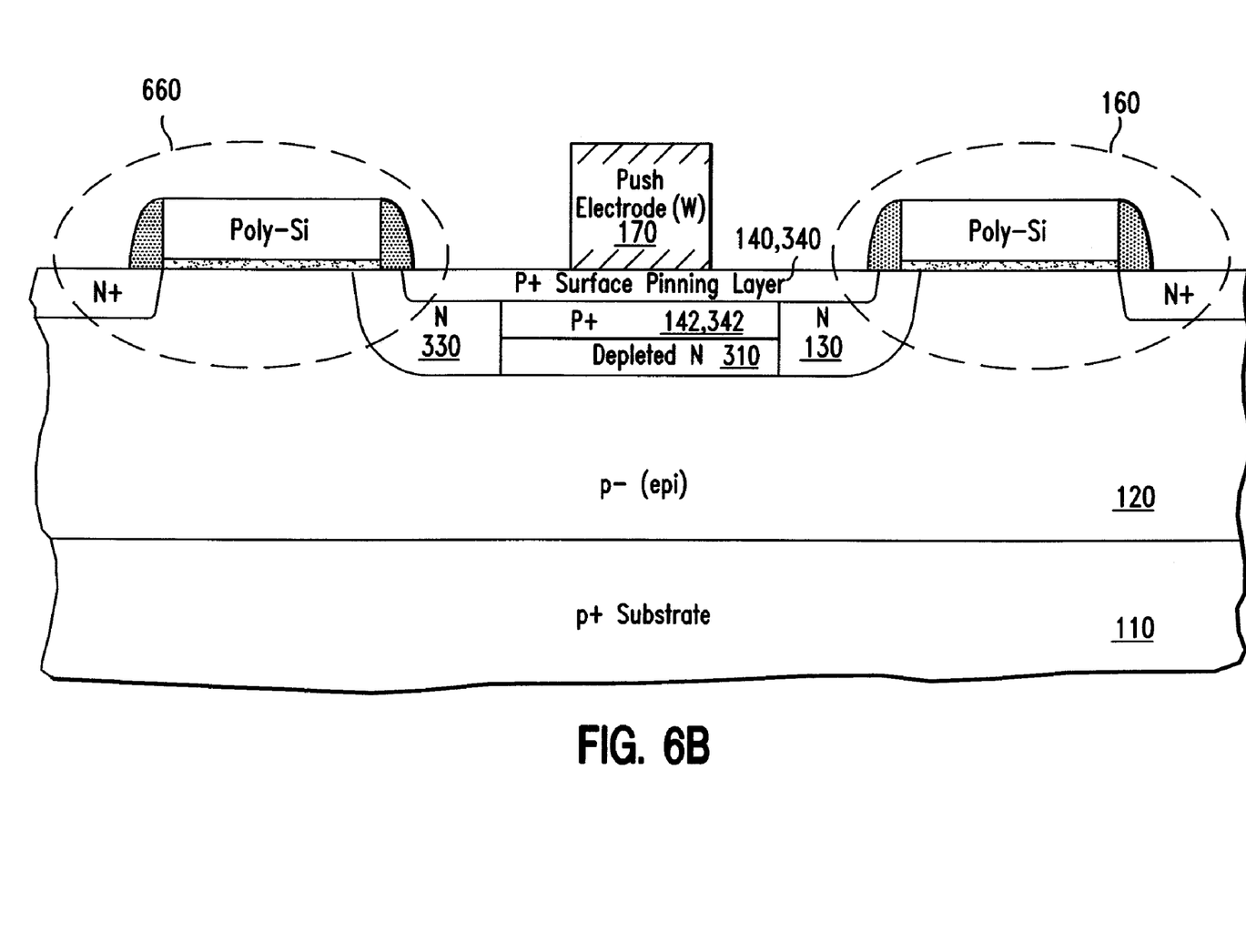

FIGS. 6A–6B illustrate a method for forming the semiconductor structure 300 of FIG. 3, in accordance with embodiments of the present invention. More specifically, with reference to FIG. 6A, the formation of the semiconductor structure 300 can start with the P+ silicon substrate 110.

Next, the P– silicon layer 120 can be formed on top of the P+ silicon substrate 110 by, illustratively, epitaxial growth. Next, an N charge collection well 130,330 can be formed in the P– silicon layer 120. Next, two transfer transistors 160 and 660 can be formed using any conventional process. Next, with reference FIG. 6B, a P+ surface pinning layer 140,340 can be formed at top of the N charge collection well 130,330. Next, the P+ cushion region 142,342 can be formed by, illustratively, forming a mask (not shown) followed by an ion implantation process. In one embodiment, the P+ cushion region 142,342 is doped with a doping concentration sufficiently high so as to create the depleted region 310 in the N charge collection well 130,330 that physically separates the N charge collection well 130,330 into two N charge collection regions 130 and 330. Finally, the push electrode 170 can be formed in direct physical contact with the P+ surface pinning layer 140,340.

In summary, the operations of the structures 100, 200, and 300 of FIGS. 1, 2, and 3, respectively are similar. That is, during the readout cycle, the push electrode is negatively biased (assuming the substrate is grounded) so as to help push the accumulated charges in the respective N charge collection well through the respective transfer transistor. Moreover, the structure 200 of FIG. 2 includes the P+ separating region 212. As a result, the leakage current is reduced. In addition, in the structure 300 of FIG. 3, the depleted N region 310 functions as a trench isolation region between the two image sensor cells 300a and 300b. As a result, no trench isolation is needed and, therefore, the fabrication process is simplified. It should be noted that in each of the structures 100, 200, and 300 of FIGS. 1, 2, and 3, respectively, the push electrode 170 can be shared by two neighboring image sensor cells formed symmetrically over the push electrode 170.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
   (a) a semiconductor substrate;
   (b) a charge collection well on the substrate, the charge collection well comprising a first semiconductor material doped with a first doping polarity;
   (c) a surface pinning layer on and in direct physical contact with the charge collection well, the surface pinning layer comprising a second semiconductor material doped with a second doping polarity opposite to the first doping polarity; and
   (d) an electrically conductive push electrode being in direct physical contact with the surface pinning layer but not being in direct physical contact with the charge collection well,
   wherein in response to the surface pinning layer and the charge collection well being in a path of light, the charge collection well is adapted for accumulating charges,
   wherein a P-N junction between the surface pinning layer and the charge collection well is adapted for becoming reverse-biased in response to the electrically conductive push electrode being at a charge pushing potential,
   wherein the charge pushing potential is lower than a potential of the substrate if the first doping polarity is an N-type, and wherein the charge pushing potential is higher than the potential of the substrate if the first doping polarity is a P-type; and (e) a transfer transistor on the semiconductor substrate,
wherein the transfer transistor includes (i) a first source/drain region, (ii) a second source/drain region, and (iii) a channel region being disposed between and in direct physical contact with the first and second source/drain regions,
wherein the first and second source/drain regions comprise dopants of the first doping polarity,
wherein the first source/drain region is in direct physical contact with the charge collection well, and
wherein the channel region comprises dopants of the second doping polarity.

2. The semiconductor structure of claim 1,
wherein the charge collection well is doped with the N-type doping polarity, and
wherein the surface pinning layer is doped with the P-type doping polarity.

3. The semiconductor structure of claim 1, further comprising a trench isolation region being in direct physical contact with the charge collection well.

4. The semiconductor structure of claim 3,
wherein the surface pinning layer is thicker in a first direction beneath the electrically conductive push electrode in the first direction than other portions of the surface pinning layer, and
wherein the first direction is perpendicular to an interfacing surface between the electrically conductive push electrode and the surface pinning layer.

5. The semiconductor structure of claim 3, further comprising:
another charge collection well on the substrate, the another charge collection well comprising a third semiconductor material doped with the first doping polarity; and
another surface pinning layer on and in direct physical contact with the another charge collection well, the another surface pinning layer comprising a fourth semiconductor material doped with the second doping polarity,
wherein the electrically conductive push electrode is in direct physical contact with the another surface pinning layer but not being in direct physical contact with the another charge collection well,
wherein in response to the another surface pinning layer and the another charge collection well being in another path of light, the another charge collection well is adapted for accumulating charges, and
wherein a p-n junction between the another surface pinning layer and the another charge collection well is adapted for becoming reverse-biased in response to the electrically conductive push electrode being at the charge pushing potential.

6. The semiconductor structure of claim 1, further comprising a trench isolation region being physically separated from the charge collection well by a separating region, wherein the separating region comprises a third semiconductor material doped with the second doping polarity.

7. The semiconductor structure of claim 6,
wherein the surface pinning layer is thicker in a first direction beneath the electrically conductive push electrode in the first direction than other portions of the surface pinning layer, and
wherein the first direction is perpendicular to an interface surface between the electrically conductive push electrode and the surface pinning layer directly.

8. The semiconductor structure of claim 6, further comprising:
another charge collection well on the substrate, the another charge collection well comprising a fourth semiconductor material doped with the first doping polarity; and
another surface pinning layer on and in direct physical contact with the another charge collection well, the another surface pinning layer comprising a fifth semiconductor material doped with the second doping polarity,
wherein the electrically conductive push electrode is in direct physical contact with the another surface pinning layer but not being in direct physical contact with the another charge collection well,
wherein in response to the another surface pinning layer and the another charge collection well being in another path of light, the another charge collection well is adapted for accumulating charges, and
wherein a P-N junction between the another surface pinning layer and the another charge collection well is adapted for becoming reverse-biased in response to the electrically conductive push electrode being at the charge pushing potential.

9. The semiconductor structure of claim 1,
wherein a portion of the surface pinning layer is doped with a dopant concentration sufficient to create a depletion region in the charge collection well, and
wherein the depletion region physically separates the charge collection well into first and second charge collection regions.

* * * * *